(12) United States Patent
Namioka et al.

(10) Patent No.: US 6,382,609 B1
(45) Date of Patent: May 7, 2002

(54) CHUCK TABLE

(75) Inventors: Shinichi Namioka; Takaaki Inoue, both of Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/564,702

(22) Filed: May 4, 2000

(30) Foreign Application Priority Data

May 10, 1999 (JP) .......................................... 11-128491

(51) Int. Cl.[7] .............................................. B23Q 3/10
(52) U.S. Cl. ........................................................ 269/21
(58) Field of Search ............................ 269/21; 279/3; 451/388; 294/64.1, 65

(56) References Cited

U.S. PATENT DOCUMENTS 4,521,995 A * 6/1985 Sekiya ........................ 269/21
5,562,276 A * 10/1996 Blick ........................... 269/21

* cited by examiner

Primary Examiner—Robert C. Watson
(74) Attorney, Agent, or Firm—Smith, Gambrell & Russell, LLP

(57) ABSTRACT

A chuck table includes a pedestal having a circular depression formed in an upper surface thereof, and a disk-like chuck plate positioned in the depression of the pedestal. The chuck plate is fixed in the depression of the pedestal by means of an adhesive interposed between a bottom surface of the depression of the pedestal and a lower surface of the chuck plate. A recess for accepting a surplus of the adhesive is formed in a lower end portion of a side surface of the depression of the pedestal.

6 Claims, 2 Drawing Sheets

CHUCK TABLE

FIELD OF THE INVENTION

This invention relates to a chuck table which is preferably used in holding a semiconductor wafer in a semiconductor wafer machining device, such as a semiconductor wafer dicer.

DESCRIPTION OF THE PRIOR ART

As is well known among people skilled in the art, a chuck table including a pedestal having a circular depression formed in its upper surface, and a disk-like chuck plate positioned in the depression of the pedestal is widely used as a chuck table for holding a semiconductor wafer in a semiconductor wafer machining device, such as a semiconductor wafer dicer. The pedestal is formed from a suitable metal such as stainless steel, and the chuck plate is formed from a porous material such as porous ceramic. An additional depression of a circular shape is formed in the center of a bottom surface of the depression of the pedestal, and communicates with a suction path. The inner diameter of the depression of the pedestal and the outer diameter of the chuck plate are substantially the same. A suitable adhesive, such as epoxy resin, is coated in a peripheral edge annular area in a lower surface of the chuck plate and/or a peripheral edge annular area, which surrounds the additional depression, in the bottom surface of the depression of the pedestal. The chuck plate is positioned and pressed in the depression of the pedestal to fix the chuck plate in the depression of the pedestal. In an outermost peripheral edge portion in the bottom surface of the depression, a recess is formed for accepting a surplus portion of the adhesive fluidly moved when pressing the chuck plate. After the chuck plate is fixed in the depression of the pedestal, the upper surface of the pedestal and an upper surface of the chuck plate are ground, whereby the upper surface of the chuck plate, and the upper surface of the pedestal surrounding the upper surface of the chuck plate are made coplanar sufficiently precisely.

The semiconductor wafer is usually mounted via a mounting tape in an opening formed in the center of a mounting frame. By gripping and transporting the frame, the semiconductor wafer mounted on the frame is positioned on the chuck plate in the chuck table. Then, a suction source, such as a vacuum pump, is actuated to suck air through the chuck plate, the additional depression, and the suction path, whereby the semiconductor wafer is attracted onto the chuck plate.

According to the present inventors' experience, the foregoing conventional chuck table poses the following problems: After repeated use, there is a tendency that the chuck plate is raised slightly (e.g., by several tens of microns) relative to the pedestal, so that the upper surface of the chuck plate, and the upper surface of the pedestal fail to be coplanar sufficiently precisely. Machining to be applied to the semiconductor wafer, such as dicing, usually involves positioning of a machining tool, such as a cutting edge, and the semiconductor wafer relative to each other, with the upper surface of the pedestal as a reference. Thus, the rise of the chuck plate relative to the pedestal means that the semiconductor wafer cannot be positioned sufficiently precisely relative to the machining tool. Moreover, the rise of the chuck plate is not uniform in the entire circumferential direction. Hence, the upper surface of the chuck plate tends to be slightly inclined, starting in an initial state, and the semiconductor wafer attracted to the chuck plate also tends to be inclined. Such inclination of the chuck plate also makes it impossible to position the semiconductor wafer sufficiently precisely relative to the machining tool.

SUMMARY OF THE INVENTION

A principal object of the present invention is to provide a novel and improved chuck table which does not raise a chuck plate relative to a pedestal after repeated use.

The inventors of the present invention conducted extensive studies. As a result, they found the following cause of the rise of the chuck plate relative to the pedestal: The surplus of the adhesive, which has flowed into the recess formed in the outermost peripheral edge portion of the depression of the pedestal and has cured there, expands owing to wetting and/or heating during repeated use of the chuck table to apply an upward force to the lower surface of the chuck plate. Based on this finding, the inventors found that the above-mentioned principal object could be attained by forming the recess for accepting the surplus adhesive in a lower end portion of a side surface of the depression, rather than in the bottom surface of the depression. When the recess is formed in the lower end portion of the side surface of the depression, the surplus adhesive that has flowed into and cured in the recess applies the force to the chuck plate not at the bottom surface of the chuck plate, but at its outer peripheral surface, even if the surplus adhesive expands during repeated use of the chuck table. The direction of the force is radially inward of the chuck plate. Therefore, the rise of the chuck plate relative to the pedestal can be prevented fully reliably.

To prevent the rise of the chuck plate due to expansion of the surplus adhesive that flowed into and cured in the recess formed in the bottom surface of the depression of the pedestal, it is conceivable to increase the depth and/or the width of the recess formed in the bottom surface of the depression. However, this measure would decrease the strength of the pedestal markedly, or would make it necessary to form the pedestal of a large size.

As a chuck table for solving the above-described technical challenge, the invention provides a chuck table including a pedestal having a circular depression formed in an upper surface thereof, and a disk-like chuck plate positioned in the depression of the pedestal, the chuck plate being fixed in the depression of the pedestal by means of an adhesive interposed between a bottom surface of the depression-and a lower surface of the chuck plate, wherein a recess for accepting a surplus of the adhesive is formed in a lower end portion of a side surface of the depression of the pedestal.

In preferred embodiments of the invention, the inner diameter of the depression of the pedestal and the outer diameter of the chuck plate are substantially the same, and an upper surface of the chuck plate and the upper surface of the pedestal are substantially coplanar. The recess is shaped like a ring extending continuously in a circumferential direction in the lower end portion of the side surface of the depression. A plurality of the recesses may be formed with spacing in the circumferential direction. Preferably, the chuck plate is formed from a porous material, an additional depression of a circular shape is formed in the center of the bottom surface of the depression of the pedestal, the additional depression communicates with a suction path, and the adhesive is interposed between a peripheral edge annular area in the bottom surface of the depression, which surrounds the additional depression, and a peripheral edge annular area in the lower surface of the chuck plate, whereby the chuck plate is fixed in the depression of the pedestal.

DETAILED DESCRIPTION OF THE PREFERRED EMBODIMENTS

Preferred embodiments of a chuck table constituted in accordance with the present invention will now be described in further detail with reference to the accompanying drawings.

Figure 1:
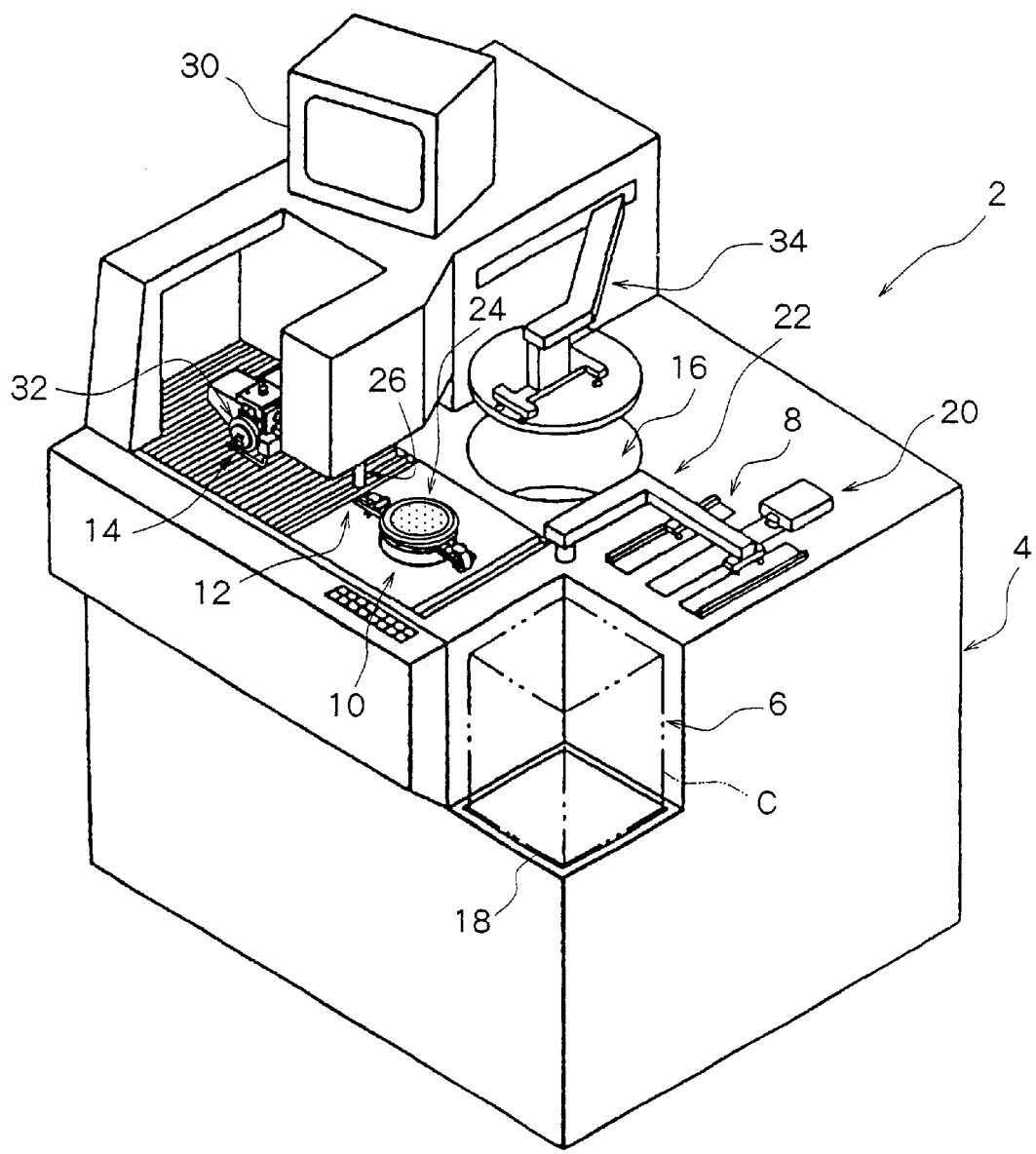
FIG. 1 is a schematic perspective view showing a dicer equipped with a preferred embodiment of a chuck table constituted in accordance with the present invention.

FIG. 1 shows a semiconductor wafer dicer equipped with a chuck table constituted in accordance with the invention. A dicer designated entirely as the numeral 2 has a housing 4. On the housing 4, a loading area 6, a waiting area 8, a chucking area 10, an alignment area 12, a cutting area 14, and a final cleaning and drying area 16 are defined. In the charging area 6, a hoisting and lowering table 18 is disposed. On the hoisting and lowering table 18, there is loaded a cassette C in which a plurality of semiconductor wafers W (FIG. 2) are accommodated with spacing in a vertical direction. As shown by two-dot chain lines in FIG. 2, the semiconductor wafer W accommodated in the cassette C is mounted in a central opening of a frame F via a mounting tape T. On a surface of the semiconductor wafer W, cutting lines L are arranged in a lattice pattern. In conjunction with the loading area 6 and the waiting area 8, first transport means 20 is disposed. In accordance with the ascent and descent of the hoisting and lowering table 18, the first transport means 20 is actuated to deliver the frame F, on which the semiconductor wafer W to be cut is mounted, sequentially from the cassette C to the waiting area 8 (and, as will be further mentioned later on, to bring the frame F, on which the semiconductor wafer W having been cut, finally cleaned and dried is mounted, from the waiting area 8 into the cassette C). In conjunction with the waiting area 8, the chucking area 10, and the final cleaning and drying area 16, second transport means 22 is disposed. The frame F delivered from the cassette C to the waiting area 8 is transported to the chucking area 10 by the second transport means 22. In the chucking area 10, the frame F, on which the semiconductor wafer W to be cut is mounted, is vacuum attracted onto a chuck table 24 (the chuck table 24 will be described in detail later on). The frame F attracted,onto the chuck table 24 in the chucking area 10 is moved in accordance with the movement of the chuck table 24, and positioned in the alignment area 12. In conjunction with the alignment area 12, imaging means 26 is disposed. The surface of the semiconductor wafer W mounted on the frame F is imaged by the imaging means 26. Based on the resulting image, the chuck table 24 (accordingly, the frame F having the semiconductor wafer W mounted thereon) is precisely positioned so that the cutting lines L arranged on the surface of the semiconductor wafer W will rest on a required relative position with respect to a cutting edge 28 disposed in conjunction with the cutting area 14. The surface of the semiconductor wafer W imaged by the imaging means 26 is displayed on a monitor 30. Then, the chuck table 24 is moved to the cutting area 14, where the semiconductor wafer W mounted on the frame F is cut along the cutting lines L by cutting means 32 having a rotating blade. This cutting is carried out such that at least the mounting tape T is uncut, while the semiconductor wafer W usually is not cut completely, but a portion thereof facing downward is left uncut. Hence, even after cutting of the semiconductor wafer W, the semiconductor wafer W continues to be mounted on the frame F via the mounting tape T.

After the semiconductor wafer W is cut as required in the cutting area 14, the frame F is returned to the chucking area 10 in accordance with the movement of the chuck table 24. In conjunction with the chucking area 10 and the final cleaning and drying area 16, third transport means 34 is disposed. By this third transport means 34, the frame F is transported to the final cleaning and drying area 16. In the final cleaning and drying area 16, the cut semiconductor wafer W is finally cleaned and dried by cleaning and drying means (not shown). Then, the frame F is returned to the waiting area 8 by the second transport means 22, and returned to the cassette C by the first transport means 20.

Constitutions other than the chuck table 24 in the illustrated dicer 2 may be in a suitable form well known among people skilled in the art, and do not constitute a part of the invention. Thus, an explanation for their details will be omitted herein.

Figure 2:
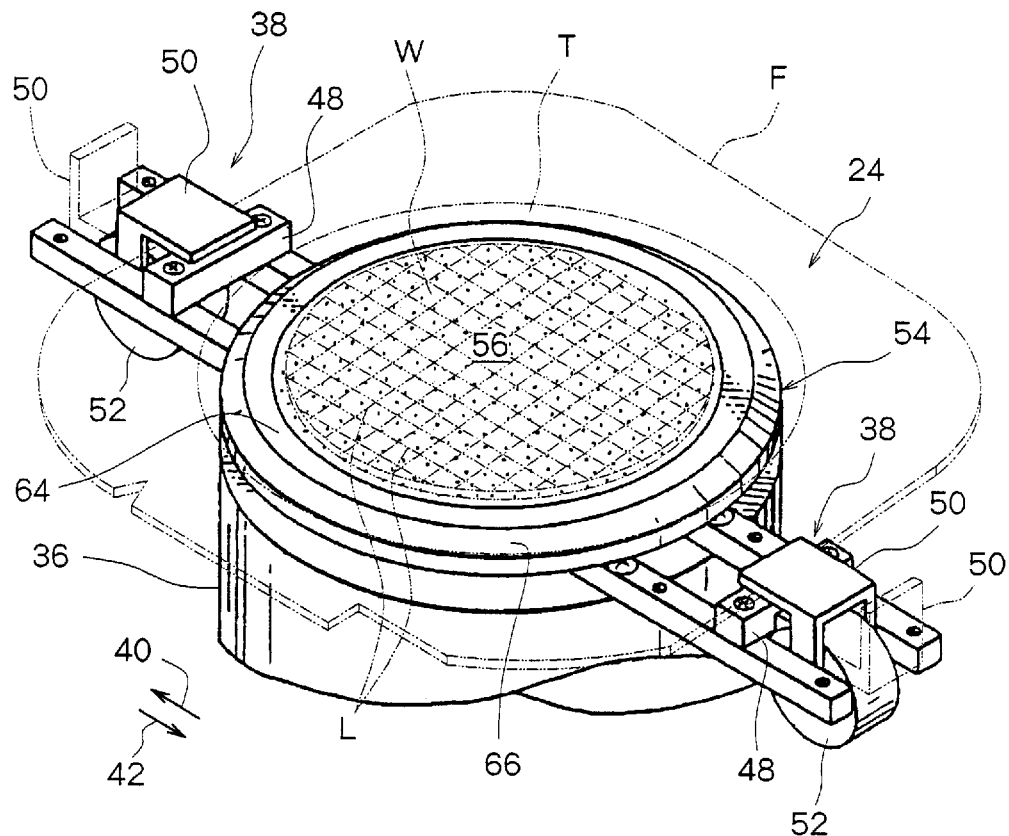
FIG. 2 is a partial perspective view showing the chuck table in the dicer of FIG. 1, and neighboring constituent elements.

Referring to FIG. 2, a nearly cylindrical driven support 36 is disposed in the illustrated dicer 2. On the driven support 36, a pair of frame gripping means 38 and the chuck table 24 are mounted. The support 36 is reciprocated substantially horizontally in directions of arrows 40 and 42 in FIG. 2, and also rotated about a central axis extending substantially vertically, by the action of drive means (not shown). Each of the pair of frame gripping means 38 includes a stationary gripping piece 48, a movable gripping piece 50, and an air actuator 52. The movable gripping piece 50 is pivoted in a reciprocating manner, by the air actuator 52, between a closing position indicated by solid lines and an opening position indicated by two-dot chain lines.

Figure 3:
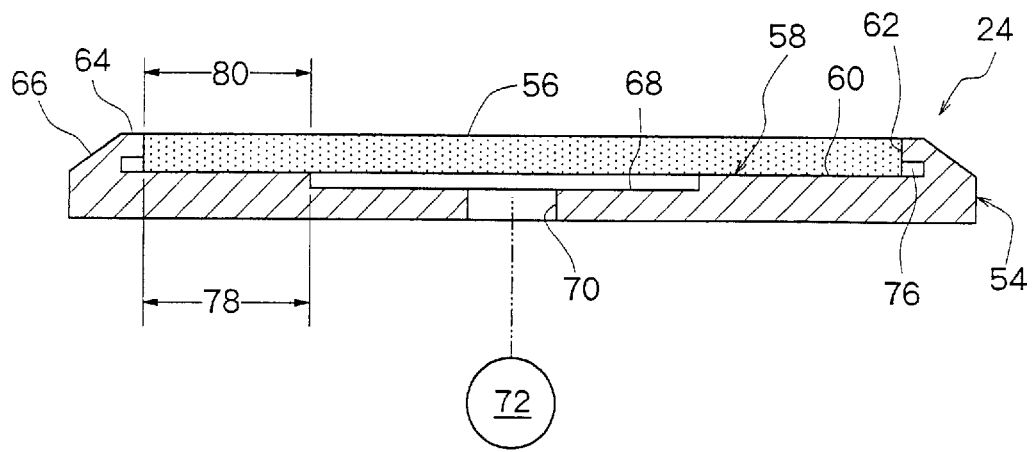
FIG. 3 is a sectional view showing the chuck table in the dicer of FIG. 1.

With reference to FIG. 3 along with FIG. 2, the chuck table 24 constituted in accordance with the invention has a pedestal 54 fixed on the support 36 by a suitable fixing means (not shown), such as bonding or screwing, and a chuck plate 56 fixed on the pedestal 54. The pedestal 54, which can be formed from a suitable metal such as stainless steel, is in a nearly circular shape, and has a circular depression 58 formed in an upper surface thereof. The depression 58 has a circular bottom surface 60 extending substantially horizontally, and a cylindrical side surface 62 extending substantially vertically. Outwardly of the depression 58, a substantially horizontal, annular upper surface 64 is disposed. Outwardly of the annular upper surface 64, a truncated conical surface 66 is disposed which extends radially outwardly with a downward slope. In the center of the bottom surface of the depression 58 formed in the pedestal 54, an additional depression 68 of a circular shape is further formed. In the pedestal 54, a suction hole 70 is also formed which extends from the center of a bottom surface of the additional depression 68 to a bottom surface of the pedestal 54. The suction hole 70 is connected to a suction source 72, which may be a vacuum pump, via a suction path (not shown).

In the chuck table 24 constituted in accordance with the invention, it is important that a recess be formed in a lower end portion of the side surface 62 in the depression 58 of the pedestal 54. In the illustrated embodiment, a ring-like recess 76 extending continuously in a circumferential direction is formed. The cross sectional shape of the recess 76 may be rectangular. If desired, a plurality of recesses extending arcuately with spacing in the circumferential direction, for example, may be formed instead of the ring-like recess 76.

The chuck plate 56 of the chuck table 24 is shaped like a disk, whose outer diameter is substantially the same as the inner diameter of the depression 58 of the pedestal 54. The-chuck plate 56 can be formed from a porous material such as porous ceramic. The chuck plate 56 is fixed in the depression 58 of the pedestal 54 by an adhesive interposed between a lower surface of the depression 58 of the pedestal 54 and a lower surface of the chuck plate 56. In further detail, according to the illustrated embodiment, a suitable adhesive, such as epoxy resin, is coated in a peripheral edge annular area 78 (especially in its outer portion), which surrounds the additional depression 68, in the bottom surface 60 of the depression 58, and/or in a peripheral edge annular area 80 (especially in its outer portion), which corresponds to the peripheral edge annular area 78, in the lower surface of the chuck plate 56. Then, the chuck plate 56 is positioned in the depression 58 of the pedestal 54, and the adhesive is cured, with the chuck plate 56 being pressed, whereby the chuck plate 56 is fixed in the depression 58 of the pedestal 54. When the chuck plate 56 is pressed, a surplus of the adhesive fluidly moves radially outwardly, and flows into the recess 76. The adhesive also fluidly moves radially inwardly. However, by coating the adhesive concentratedly in the outer portion of the peripheral edge annular area 78 and/or the peripheral edge annular area 80, it becomes possible to prevent or suppress the surplus adhesive fluidly moving radially inwardly and flowing into the additional depression 68.

In the illustrated embodiment, as described above, after the chuck plate 56 is fixed in the depression 58 of the pedestal 54, the upper surface of the chuck plate 56 and the annular upper surface 64 of the pedestal 54 are both ground by suitable grinding means. By this measure, the upper surface of the chuck plate 56, and the annular upper surface 64 of the pedestal 54 surrounding the upper surface of the chuck plate 56 are caused to form the same plane extending substantially horizontally in a sufficiently precise manner.

When the semiconductor wafer W is to be attracted onto the chuck table 24 and held there, the movable gripping pieces 50 of the pair of frame gripping means 38 are each brought to the opening position indicated by the two-dot chain lines in FIG. 2. In this state, the frame F is carried onto the stationary gripping pieces 48 of the pair of frame gripping means 38. Thus, the semiconductor wafer W mounted in the central opening of the frame F via the mounting tape T is positioned on the chuck plate 56 of the chuck table 24. Then, the movable gripping pieces 50 of the pair of frame gripping means 38 are each moved to the closing position indicated by the solid lines in FIG. 2, whereby the frame F is gripped between the stationary gripping pieces 48 and the movable gripping pieces 50. Substantially simultaneously, or thereafter, the suction source 72 is energized to suck air through the chuck plate 56, the additional. depression 68, and the suction hole 70, whereby the semiconductor wafer W is attracted onto the chuck plate 56.

The surplus adhesive, which has flowed into the recess 76 formed in the lower end portion of the side surface of the depression 58 of the pedestal 54 and has cured there at the time of fixing the chuck plate 56 in the depression 58, tends to expand owing to wetting and/or heating, imposing a force on the chuck plate 56. However, the force imposed by the adhesive expanded in the recess 76 onto the chuck plate 56 acts on the peripheral side surface of the chuck plate 56, and the direction of the force is radially outward. Such a force does not cause the chuck plate 56 to move relative to the pedestal 54. With a conventional chuck table, on the other hand, a recess for accepting surplus adhesive is formed in the bottom surface of the depression, as stated earlier. Hence, when the adhesive, which has flowed into and cured in the recess, is expanded, an upward force is applied to the lower surface of the chuck plate. As a result, the chuck plate tends to be moved upward relative to the pedestal.

As described above, the invention makes it possible to prevent or suppress the situation that surplus adhesive fluidly moves radially inwardly and flows into the additional depression 68. Even if some surplus adhesive flowed into the additional depression 68, the upward movement of the chuck plate 56 relative to the pedestal 54 due to this flow could be substantially prevented, because the volume of the additional depression 68 could be made relatively large.

The preferred embodiments of the chuck table constituted in accordance with the invention have been described in detail with reference to the accompanying drawings. It should be understood that the invention is not restricted to such embodiments, but various changes and modifications may be made without departing from the spirit and scope of the invention.

What we claim is:

1. A chuck table including a pedestal having a circular depression formed in an upper surface thereof, and a disk-like chuck plate positioned in the depression of the pedestal, the chuck plate being fixed in the depression of the pedestal by means of an adhesive interposed between a bottom surface of the depression and a lower surface of the chuck plate, wherein
    a recess containing a surplus of the adhesive is formed in a lower end portion of a substantially vertical side surface of the depression of the pedestal.
2. The chuck table of claim 1, wherein an inner diameter of the depression of the pedestal and an outer diameter of the chuck plate are substantially the same.
3. The chuck table of claim 1, wherein an upper surface of the chuck plate and the upper surface of the pedestal are substantially coplanar.
4. The chuck table of claim 1, wherein the recess is shaped like a ring extending continuously in a circumferential direction in the lower end portion of the substantially vertical side surface of the depression.
5. The chuck table of claim 1, wherein a plurality of the recesses are formed with spacing in the circumferential direction.
6. The chuck table of claim 1, wherein
    the chuck plate is formed from a porous material,
    an additional depression of a circular shape is formed in a center of the bottom surface of the depression of the pedestal,
    the additional depression communicates with a suction path, and
    the adhesive is interposed between a peripheral edge annular area in the bottom surface of the depression, which surrounds the additional depression, and a peripheral edge annular area in the lower surface of the chuck plate, whereby the chuck plate is fixed in the depression of the pedestal.

* * * * *